United States Patent
Greenspan et al.

(10) Patent No.: US 9,971,691 B2
(45) Date of Patent: May 15, 2018

(54) SELEVTIVE APPLICATION OF INTERLEAVE BASED ON TYPE OF DATA TO BE STORED IN MEMORY

(71) Applicant: Intel Corporation, Santa Clara, CA (US)

(72) Inventors: Daniel Greenspan, Jerusalem (IL); Blaise Fanning, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/263,148

(22) Filed: Sep. 12, 2016

(65) Prior Publication Data
US 2018/0074961 A1    Mar. 15, 2018

(51) Int. Cl.
*G06F 12/0846* (2016.01)
*G06F 12/0831* (2016.01)
*G11C 7/10* (2006.01)
*G06F 12/0811* (2016.01)

(52) U.S. Cl.
CPC ...... *G06F 12/0851* (2013.01); *G06F 12/0811* (2013.01); *G06F 12/0831* (2013.01); *G11C 7/1072* (2013.01); *G06F 2212/283* (2013.01); *G06F 2212/621* (2013.01)

(58) Field of Classification Search
CPC ............. G06F 12/0817; G06F 12/0888; G06F 12/0846; G06F 12/0851
See application file for complete search history.

(56) References Cited

U.S. PATENT DOCUMENTS

| | | | | | |
|---|---|---|---|---|---|
| 4,984,100 | A | * | 1/1991 | Takayama | G11B 5/59655 360/40 |
| 5,581,734 | A | * | 12/1996 | DiBrino | G06F 12/084 710/35 |
| 5,761,695 | A | * | 6/1998 | Maeda | G06F 12/0607 711/118 |
| 5,845,329 | A | * | 12/1998 | Onishi | G06F 3/0613 707/999.202 |
| 5,926,474 | A | * | 7/1999 | Bolosky | H04L 49/20 348/E5.008 |
| 5,996,042 | A | * | 11/1999 | Pawlowski | G06F 13/1668 711/105 |
| 6,108,745 | A | * | 8/2000 | Gupta | G06F 12/0215 711/127 |
| 6,263,409 | B1 | * | 7/2001 | Haupt | G06F 13/1626 710/39 |

(Continued)

OTHER PUBLICATIONS

International Search Report dated Oct. 10, 2017, in PCT Application No. PCT/US2017/047773, filed Aug. 21, 2017, 13 pages.

*Primary Examiner* — Midys Rojas
*Assistant Examiner* — Khoa D Doan
(74) *Attorney, Agent, or Firm* — Thorpe North & Western, LLP

(57) ABSTRACT

Technology for an apparatus is described. The apparatus can include a plurality of cache memories and a cache controller. The cache controller can allocate a cache entry to store data across the plurality of cache memories. The cache entry can include a value in a metadata field indicating an interleave policy. The cache controller can selectively assign the interleave policy to be applied based on a type of data stored in the plurality of cache memories.

25 Claims, 13 Drawing Sheets

(56) References Cited

U.S. PATENT DOCUMENTS

| | | | | |
|---|---|---|---|---|
| 6,272,594 B1* | 8/2001 | Gupta | G06F 12/0851 | 711/127 |
| 6,314,501 B1* | 11/2001 | Gulick | G06F 9/54 | 711/153 |
| 6,381,668 B1* | 4/2002 | Lunteren | G06F 12/0607 | 711/157 |
| 6,415,364 B1* | 7/2002 | Bauman | G06F 12/0817 | 710/20 |
| 6,480,943 B1* | 11/2002 | Douglas | G06F 12/0607 | 711/127 |
| 6,826,664 B2* | 11/2004 | Hocker | G11B 27/10 | 707/999.102 |
| 7,266,651 B1* | 9/2007 | Cypher | G06F 12/0851 | 365/230.03 |
| 7,277,977 B2* | 10/2007 | Kook | G06F 12/0893 | 711/105 |
| 7,996,597 B1* | 8/2011 | Venkatramani | G06F 12/0607 | 711/157 |
| 8,281,086 B2* | 10/2012 | Chi | H03M 13/2764 | 711/157 |
| 8,442,063 B1* | 5/2013 | Zhou | H04L 12/1881 | 370/413 |
| 8,706,945 B2* | 4/2014 | Takaku | G06F 13/1668 | 711/2 |
| 8,732,435 B1* | 5/2014 | Chou | G06F 9/3455 | 711/217 |
| 8,806,149 B2* | 8/2014 | Yamada | G06F 17/5022 | 711/154 |
| 8,949,527 B2* | 2/2015 | Kotzur | G06F 11/1076 | 711/114 |
| 9,563,549 B2* | 2/2017 | Ahn | G06F 12/0246 | |
| 2003/0088821 A1* | 5/2003 | Yokokawa | H03M 13/235 | 714/788 |
| 2004/0168011 A1* | 8/2004 | Hemming | H03M 13/2771 | 711/5 |
| 2006/0233030 A1* | 10/2006 | Choi | G11C 7/1045 | 365/191 |
| 2008/0250212 A1* | 10/2008 | Asaro | G06F 12/0607 | 711/157 |
| 2008/0256297 A1* | 10/2008 | Bercovich | G06F 12/0851 | 711/122 |
| 2008/0270743 A1* | 10/2008 | Hornung | G06F 12/0607 | 711/210 |
| 2008/0320254 A1 | 12/2008 | Wingard et al. | | |
| 2009/0006760 A1* | 1/2009 | Bartley | G06F 12/0844 | 711/131 |
| 2009/0083491 A1* | 3/2009 | Berger | G06F 12/084 | 711/131 |
| 2009/0307434 A1 | 12/2009 | Sivaramakrishnan et al. | | |
| 2010/0121865 A1* | 5/2010 | Vaid | G06F 17/30979 | 707/758 |
| 2010/0146209 A1 | 6/2010 | Burger et al. | | |
| 2010/0325374 A1* | 12/2010 | Cypher | G06F 12/0607 | 711/157 |
| 2010/0332775 A1* | 12/2010 | Kapil | G06F 12/0607 | 711/157 |
| 2011/0179239 A1* | 7/2011 | Kajigaya | G11C 7/1012 | 711/157 |
| 2011/0225369 A1* | 9/2011 | Park | G06F 12/0846 | 711/131 |
| 2011/0320725 A1* | 12/2011 | Dunn Berger | G06F 12/0811 | 711/127 |
| 2012/0102379 A1* | 4/2012 | D'Abreu | G06F 11/1072 | 714/763 |
| 2012/0166694 A1* | 6/2012 | Dosh | G06F 13/4234 | 710/110 |
| 2013/0135007 A1* | 5/2013 | Surico | H03K 19/17768 | 326/38 |
| 2013/0232304 A1* | 9/2013 | Lohman | G06F 12/0607 | 711/127 |
| 2013/0268728 A1* | 10/2013 | Ramanujan | G06F 12/0815 | 711/105 |
| 2013/0339640 A1* | 12/2013 | Cho | G06F 12/0607 | 711/157 |
| 2013/0346682 A1* | 12/2013 | Zeffer | G06F 11/3612 | 711/105 |
| 2014/0068125 A1* | 3/2014 | Pullagoundapatti | G06F 13/404 | 710/110 |
| 2014/0129775 A1* | 5/2014 | Ruehle | G06F 12/0802 | 711/127 |
| 2014/0189213 A1* | 7/2014 | Fujiki | G06F 12/0246 | 711/103 |
| 2015/0032926 A1* | 1/2015 | Zhao | G06F 13/1647 | 710/110 |
| 2015/0082002 A1* | 3/2015 | Parra | G06F 13/16 | 711/216 |
| 2015/0212942 A1* | 7/2015 | Yang | G06F 12/0851 | 711/119 |
| 2016/0124866 A1* | 5/2016 | Jeong | G06F 12/0207 | 711/144 |
| 2016/0202991 A1* | 7/2016 | Eisen | G06F 9/3851 | 712/215 |
| 2016/0232091 A1* | 8/2016 | Wang | G06F 12/084 | |
| 2016/0335187 A1* | 11/2016 | Greenspan | G06F 12/0864 | |

* cited by examiner

|  | Coarse Striping (e.g., 4 KB) | | Fine Striping (e.g., 128 B) | |
| --- | --- | --- | --- | --- |
|  | Effect on Stream | Effect on other computer operations | Effect on Stream | Effect on other computer operations |
| High-bandwidth stream | Requests hot-spot to a single memory bank, which reduces performance | Requests become back-pressured due to congestion, which reduces performance |  |  |
| Low-bandwidth stream |  |  | Increased page open operations, which impact power and performance | Reduced page-hit events, which impact power and performance |

FIG. 1

SELEVTIVE APPLICATION OF INTERLEAVE BASED ON TYPE OF DATA TO BE STORED IN MEMORY

BACKGROUND

Memory devices are typically provided as internal, semiconductor, integrated circuits in computers or other electronic devices. There are many different types of memory including volatile memory, for example, dynamic random access memory (DRAM) and static random access memory (SRAM), and non-volatile memory, for example, flash memory.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIG. 1 depicts a table illustrating disadvantages of data interleaving for various memory bandwidth data streams in accordance with an example;

Figure 2:
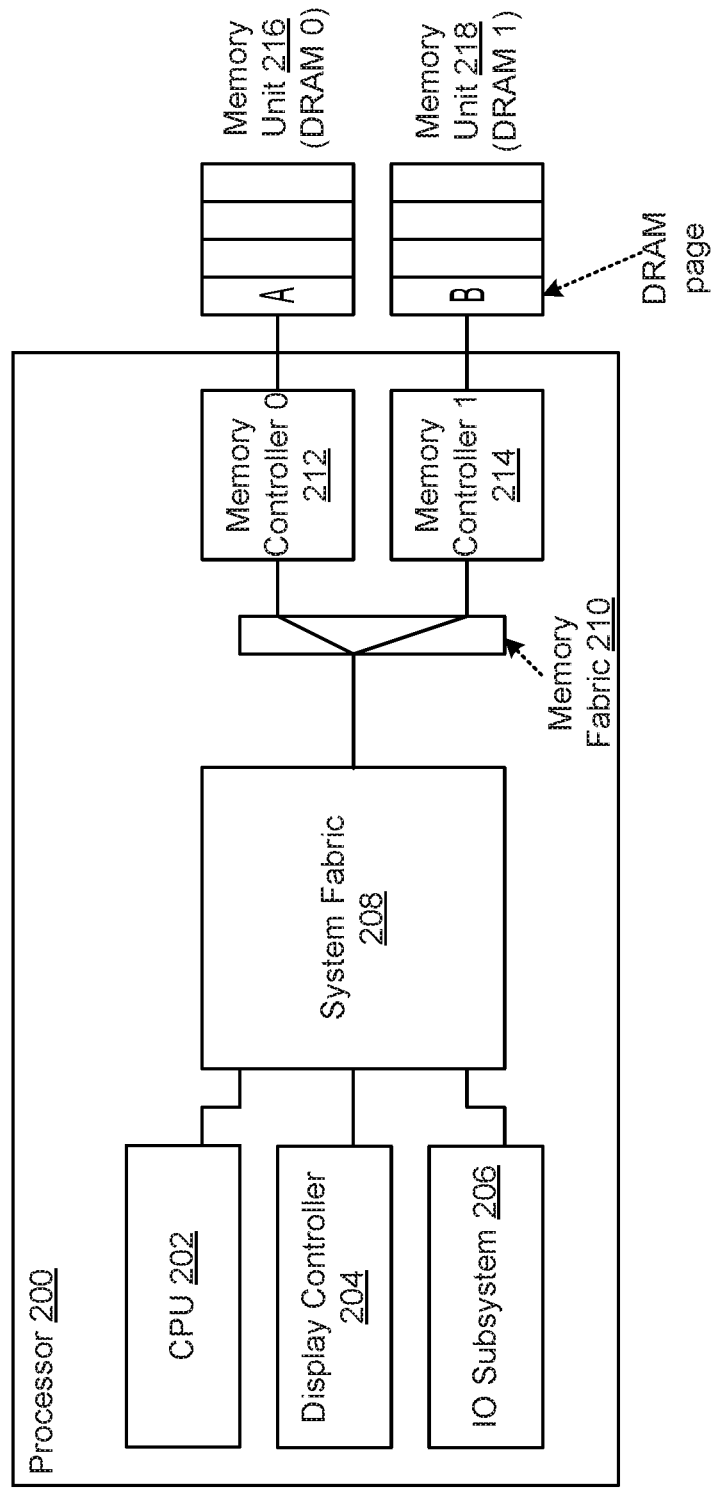
FIG. 2 depicts a computer system that includes multiple memory controllers for accessing data stored in multiple memory units in accordance with an example.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In computer data storage on a computer system, data interleaving (or data striping) is a technique for logically segmenting data (e.g., a data file), such that segments of data are stored separately across multiple memory units. In one example, the memory units can include volatile memory, such as dynamic random-access memory (DRAM). The data segments (e.g., 512 bytes in length) can be concurrently written across the multiple memory units, for example, by alternating requests to memory units every 128 bytes. Similarly, the data segments can be concurrently read from the multiple memory units. As a result, memory bandwidth can be increased when data interleaving is employed across multiple memory units. The memory bandwidth indicates the rate at which data can be read from or written to memory, and the memory bandwidth can be expressed in terms of bytes per second. In one example, the data interleaving can be performed in a round-robin manner, such that the data segments can be interleaved on the multiple memory units starting from a beginning of a data sequence. Such a technique can be well suited for streaming data, but can be inefficient when a desired bandwidth is low as multiple memory units are brought into action in serving a stream of requests whose bandwidth may capably be handled by a single memory unit.

In one example, high-bandwidth data streams can benefit when the data is interleaved or striped across the multiple memory units. Examples of high-bandwidth data streams can be those of a display engine or graphics engine. In these cases, data interleaving can be desirable because the resulting increased memory bandwidth improves throughput and performance. When data interleaving is used, the impact of the high-bandwidth data streams on other operations on the computer system can be reduced. On the other hand, low-bandwidth data streams can be negatively impacted when the data is interleaved or striped across the multiple memory units. An example of a low-bandwidth stream is that of a software application. In this case, data interleaving can be undesirable due to reduction in throughput and performance. In addition, the data interleaving of low-band data streams can negatively affect other operations on the computer system.

FIG. 1 depicts an exemplary table illustrating disadvantages of two different data interleaving (or striping) options across multiple memory units for various memory bandwidth data streams. The data interleaving can be coarse or fine, reflecting on the size of the data segments interleaved across the multiple memory units. As a non-limiting example, coarse data interleaving can involve segmenting data into 4 kilobyte (KB) chunks across the multiple memory units, and fine data interleaving can involve segmenting data into 128 byte (B) chunks across the multiple memory units. One KB can refer to 1024 bytes. The data streams can be high-bandwidth or low-bandwidth. For example, high-bandwidth data streams can be those of display or graphics engines, and low-bandwidth data streams can be those of software applications.

In one example, with respect to the effect of coarse data interleaving on the high-bandwidth data streams, an increased number of memory requests can be directed to a single memory unit, which can reduce performance, for example by causing temporary blocking at data bottle-necks. In addition, with respect to the effect of coarse data interleaving on the high-bandwidth data streams, memory requests for other computer system operations can become delayed, which can reduce performance.

In one example, computer systems that employ data interleaving can support a defined granularity level with respect to the data interleaving (e.g., 128 B, 4 KB), and this granularity, if configurable, can be selected during an initial configuration of memory sub-systems after system power-up. However, while data interleaving can be beneficial to some data streams, such as high-bandwidth data streams, the usage of data interleaving can be detrimental to other data streams, such as low-bandwidth data streams. However, in previous solutions, when the computer system employs data interleaving, the data interleaving is applied identically to both the high-bandwidth data streams and the low-bandwidth data streams. In other words, previous solutions do not offer a mechanism to selectively apply data interleaving for different data streams.

As explained in further detail below, in embodiments of the present technology, additional flexibility can be added to data interleaving on the computer system. For example, a cache entry can be created when the data is copied from memory into the cache, and the cache entry can include copied data as well as a memory location. For each cache entry that is allocated by a cache controller for data storage, an individual interleave policy (or striping policy) can be selected and applied for data stored for that cache entry. As a result, the interleave policy can be applied on a more granular level across the multiple streams and operations being performed by the computer system, as opposed to an overall interleave policy. For example, each page of data to be accessed (e.g., write or read) can be associated with a different interleave policy. Therefore, on the computer system, fine-grained interleaved data storage suited for graphics and display can coexist with coarse-grained data storage suited for software applications, each operating with the best suited interleave policy.

FIG. 2 depicts an exemplary processor 200 that includes multiple memory controllers for accessing data stored in multiple memory units. The processor 200 can be included in a one-level memory (1LM) computer system. The multiple memory units can include a first memory unit 216 (DRAM 0) and a second memory unit 218 (DRAM 1). The first memory unit 216 and the second memory unit 218 can each include a plurality of pages (e.g., millions of DRAM pages), and each page can be 4 kilobytes (KB) in size. The multiple memory controllers can include a first memory controller 212 (memory controller 0) and a second memory controller 212 (memory controller 1). In this example, the first memory controller 212 (memory controller 0) can be used to read data from the first memory unit 216 (DRAM 0) or write data to the first memory unit 216 (DRAM 0). Similarly, the second memory controller 214 (memory controller 1) can be used to read data from the second memory unit 218 (DRAM 1) or write data to the second memory unit 218 (DRAM 1). The multiple memory controllers and the memory units can be employed to increase the overall memory bandwidth.

In one example, the processor 200 can be a system on chip (SOC). The processor 200 can include a central processing unit (CPU) 202 with one or more processors for processing data in the computer system, a display controller 204 (or display engine) for controlling output data for display, and an input/output (I/O) subsystem 206 for inputting and outputting data for the computer system. The CPU 202, display controller 204 and I/O subsystem 206 can be connected using a system fabric 208. The system fabric 208 can be a hardware fabric that connects to multiple memory controllers, as well as other components of the processor 200. The system fabric 208 can be an interconnect mechanism that is formed using mesh connections, by a central switching mechanism, a ring, a bus, or other topology. The system fabric 208 can be connected to the first and second memory controllers 212, 214 using a memory fabric 210. The memory fabric 210 can be a hardware fabric for distributing memory commands or transactions to the first and second memory controllers 212, 214. In an alternative configuration, the system fabric 208 can be merged with the memory fabric 210, or based on merging of various bus topologies, ring topologies, etc. As an example, the memory fabric 210 can be connected to the first memory controller 212 (memory controller 0) and the second memory controller 214 (memory controller 1), which can be connected to the first memory unit 216 (DRAM 0) and the second memory unit 218 (DRAM 1), respectively. The functionality of the memory fabric 210 can be subsumed into a system fabric, for example by a system fabric that connects to the first and second memory controllers 212, 214.

In one example, the memory fabric 210 can send memory commands or memory transactions (e.g., write or read commands) to a selected memory controller (e.g., memory controller 0 or memory controller 1), and the selected memory controller can perform the memory command or memory transaction with respect to the corresponding memory unit (e.g., DRAM 0 or DRAM 1). Memory commands or transactions to a same system memory address can be served by the same memory unit. The memory fabric 210 can distribute memory transactions or commands between the multiple memory controllers (e.g., the first and second memory controllers 212, 214).

Alternatively, a single memory controller can be used to service the multiple memory units (e.g., DRAM 0 or DRAM 1). In this example, the single memory controller can select a particular memory unit for performing the memory transaction.

As shown in FIG. 2, the first memory unit 216 (DRAM 0) and the second memory unit 218 (DRAM 1) can each include a plurality of pages, such as pages of memory allocated to store the operating system (OS). Each page can be approximately 4 KB (or 4096 bytes) in size, which corresponds to a granularity at which the OS allocates memory. Based on instructions received from the memory fabric 210, the first memory controller 212 (memory controller 0) can write data block A in a first page of the first memory unit 216 (DRAM 0), and the second memory controller 214 (memory controller 1) can write data block B in a first page of the second memory unit 218 (DRAM 1). The data blocks A and B can be 4 KB in size, which corresponds to the first pages of the first and second memory units 216, 218 (DRAM 0 and DRAM 1), respectively. In this example, all of data block A is stored on a single page in the first memory unit 216 (DRAM 0), and all of data block B is stored on a single page of the second memory unit 218 (DRAM 1). In other words, in this example, each memory assignment is with respect to a data block of 4096 bytes, which corresponds to an interleave of 4096 bytes (or 4 KB).

Figure 3:
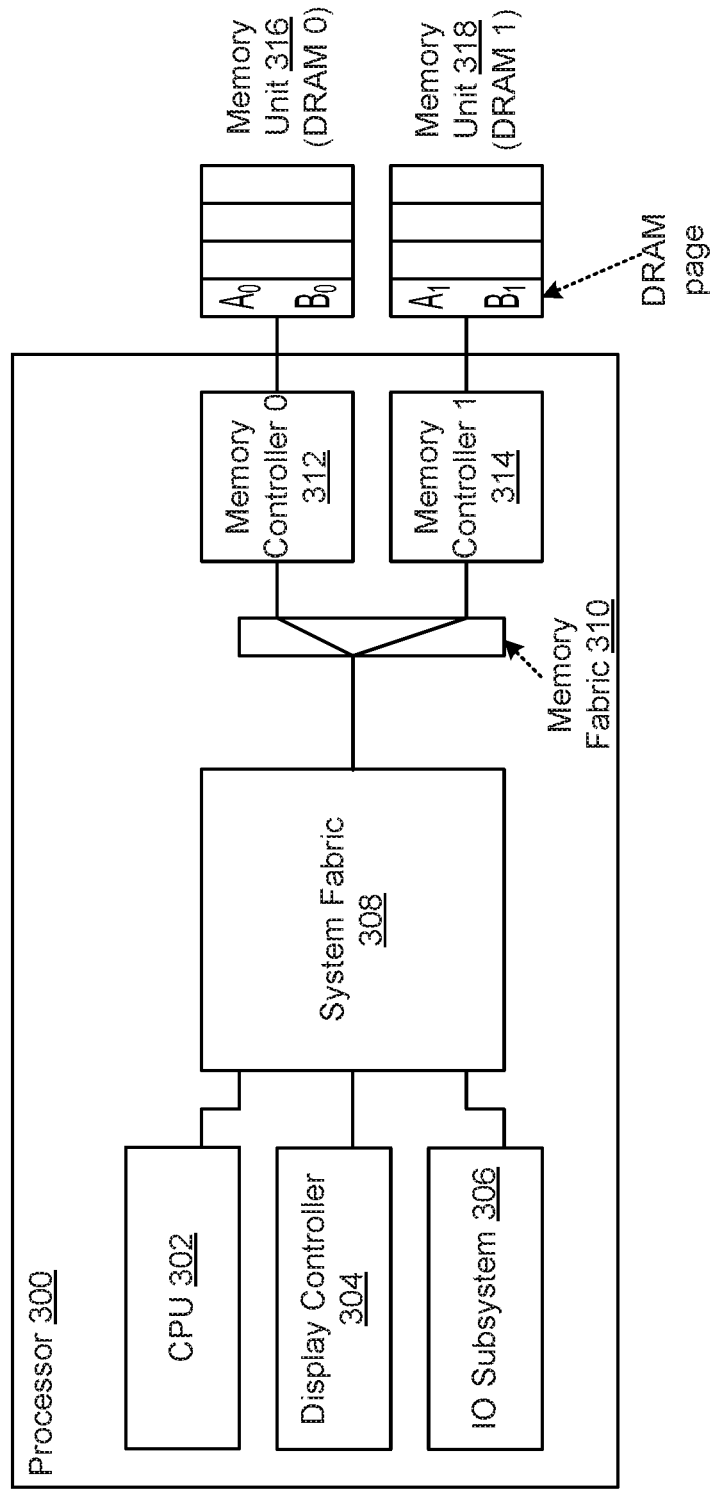
FIG. 3 depicts a computer system that includes multiple memory controllers for accessing data stored in multiple memory units in accordance with an example.

FIG. 3 depicts an exemplary processor 300 that includes multiple memory controllers for accessing data stored in multiple memory units. The processor 300 can be a system on chip (SOC). The processor 300 can be included in a one-level memory (1LM) computer system. The multiple memory units can include a first memory unit 316 (DRAM 0) and a second memory unit 318 (DRAM 1). The multiple memory controllers can include a first memory controller 312 (memory controller 0) and a second memory controller 312 (memory controller 1). The processor 300 can include a central processing unit (CPU) 302, a display controller 304 (or display engine), and an input/output (I/O) subsystem 208. The CPU 302, display controller 304 and I/O subsystem 306 can be connected to a system fabric 308. The system fabric 308 can be connected to a memory fabric 310, which can be connected to the first memory controller 312 (memory controller 0) and the second memory controller 314 (memory controller 1).

In one example, to support high-bandwidth data streams, data storage can be interleaved across the first memory unit 316 (DRAM 0) and the second memory unit 318 (DRAM 1). The first memory unit 316 (DRAM 0) and the second memory unit 218 (DRAM 1) can each include a plurality of pages, such as operating system (OS) pages, and each page can be 4 KB (or 4096 bytes) in size. Based on instructions received from the memory fabric 310, the first memory controller 312 (memory controller 0) can write a first chunk of data block A ($A_0$) in a part of a first page of the first memory unit 316 (DRAM 0), and the first memory controller 312 (memory controller 0) can write a first chunk of data block B ($B_0$) in the remaining part of the first page of the first memory unit 316 (DRAM 0). Similarly, the second memory controller 314 (memory controller 1) can write a second chunk of data block A ($A_1$) in a part of a first page of the second memory unit 318 (DRAM 1), and the second memory controller 314 (memory controller 1) can write a second chunk of data block B ($B_1$) in remaining part of the first page of the second memory unit 318 (DRAM 1). Therefore, two single OS pages of data can each be interleaved or spread across both the first and second memory units 316, 318 (DRAM 0 and DRAM 1), such that a single memory page on each of the first and second memory units 316, 318 (DRAM 0 and DRAM 1) each include chunks which together contain half the data of OS page A and chunks which together contain half the data of OS page B, and where taken together, all the chunks held in the single memory page on both of the first and second memory units contains all the data of both of OS page A and OS page B.

In one example, the data storage can be interleaved across the first and second memory units 316, 318 every 128 bytes. In other words, rather than storing an entire 4 KB data block on a single page (as shown in FIG. 2), the 4 KB data block can be broken up into 128 byte data chunks and stored in an interleaved manner across the first and second memory units 316, 318.

In one example, memory commands or transactions (such as a stream of read requests) sent from the memory fabric 310 can involve concurrently reading data from both the first and second memory units 316, 318 (DRAM 0 and DRAM 1) to achieve an increased memory bandwidth. For example, for a high-bandwidth data stream, the memory fabric 310 may send a stream of commands to read a burst of data totaling 512 bytes, and the data may be spread across both the first and second memory units 316, 318 (DRAM 0 and DRAM 1). Therefore, by sending the relevant requests from the stream to each controller accordingly the memory fabric 310 can instruct both the first and second memory controllers 312, 314 (memory controller 0 and memory controller 1) to read the data from both the first and second memory units 316, 318 (DRAM 0 and DRAM 1) in a concurrent manner, such that an aggregate memory bandwidth can be utilized. In this example, the first and second memory controllers 312, 314 (memory controller 0 and memory controller 1) can read 128 byte data chunks at a time (since the data storage was originally interleaved in 128 byte data chunks), and thus 256 bytes of data can be extracted from the pair of memory units 316, 318 (DRAM 0 and DRAM 1) in half the time that it would have taken to extract this data in a computer system where all bytes of this data would have been stored in a single memory unit.

With respect to FIG. 3, the data interleaving with a page size smaller than the OS page size can improve the performance of high-bandwidth streams, but as previously discussed, other computer system operations can be negatively affected when data storage is interleaved across the first and second memory units 316, 318 (DRAM 0 and DRAM 1) in this manner.

Figure 4:
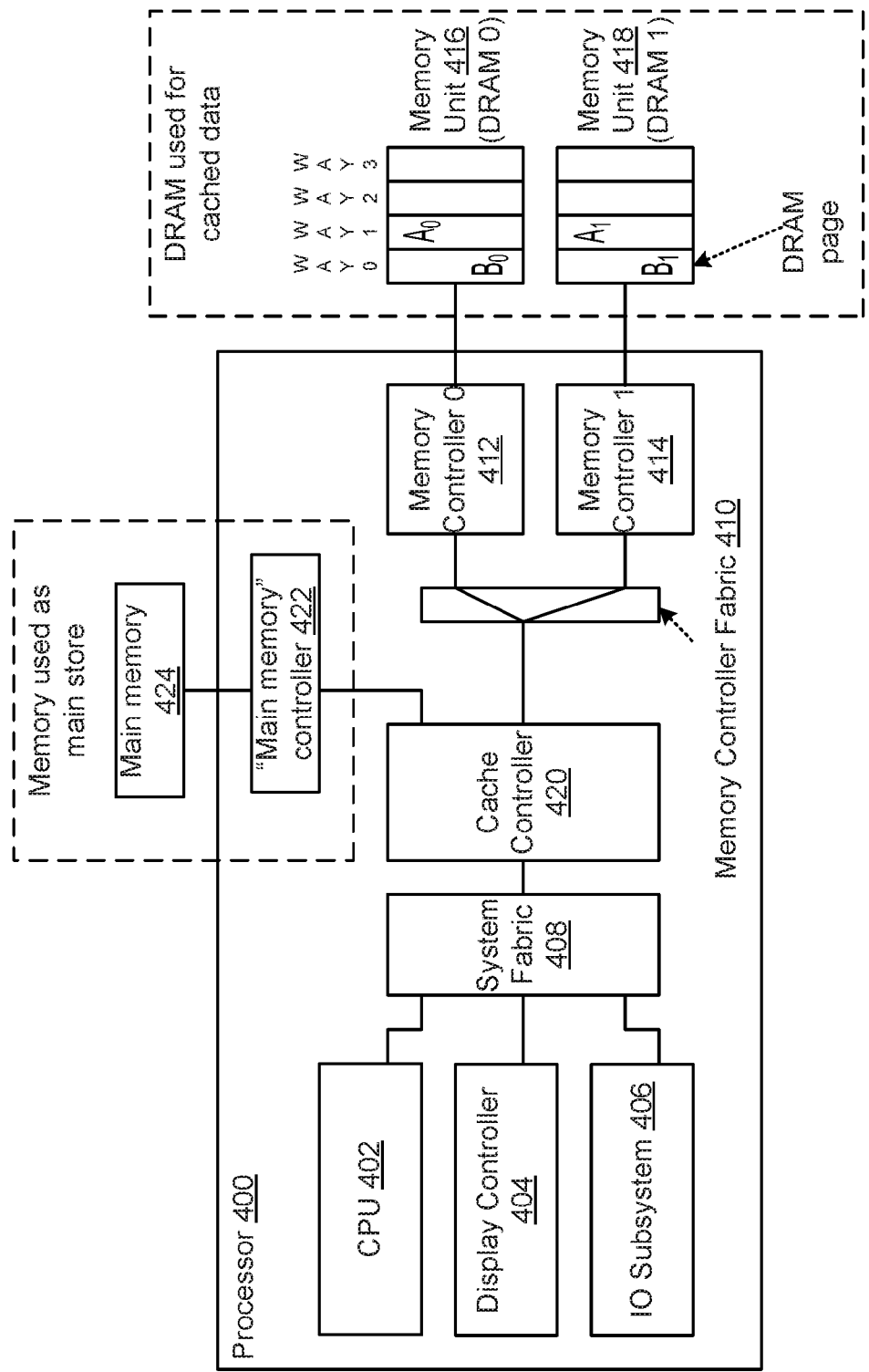
FIG. 4 depicts a computer system that includes a cache controller for facilitating data access with respect to multiple cache memory units in accordance with an example.

FIG. 4 depicts an exemplary processor 400 that includes a cache controller 420 for facilitating data access with respect to multiple memory units that form data storage for the cache. The processor 400 can be a system on chip (SOC). The processor 400 can be included in a two-level memory (2LM) computer system. The first level of memory in the 2LM computer system can be a first data store (e.g., main memory 424) that comprises volatile or non-volatile memory storage, and the second level of memory in the 2LM computer system can be second data store(s) (e.g., first and second memory units 416, 418) that comprise volatile memory storage (e.g., DRAM). The first data store can be utilized as a main memory and the second data store can be utilized for cached data.

The multiple memory units can include the first memory unit 416 (DRAM 0) and the second memory unit 418 (DRAM 1). The multiple memory controllers can include a first memory controller 412 (memory controller 0) and a second memory controller 412 (memory controller 1). The processor 400 can include a central processing unit (CPU) 402, a display controller 404 (or display engine), and an input/output (I/O) subsystem 408. The CPU 402, display controller 404 and I/O subsystem 406 can be connected to a system fabric 408. The system fabric 408 can be connected to the cache controller 420. The cache controller 420 can be connected to the main memory controller 422 and a main memory 424. The main memory controller 422 and the main memory 424 can be the first level of memory in the 2LM computer system. In addition, the cache controller 420 can be connected to a memory controller fabric 410, which can be connected to the first memory controller 412 (memory controller 0) and the second memory controller 414 (memory controller 1). The memory controller fabric 410 can be an interconnect between the cache controller 420 and the first and second memory controllers 412, 414. The first and second memory units 416, 418 (DRAM 0 and DRAM 1) can be utilized as memories for the cache that is formed together with cache controller 420. The first memory unit 416 and the second memory unit 418 can be the second level of memory in the 2LM computer system. Typically, the first and second memory units 416, 418 (DRAM 0 and DRAM 1) can be designed to have a faster data access time (for example read fetch latency) and a higher bandwidth as compared to the main memory 424. In one example, the first and second memory units 416, 418 (DRAM 0 and DRAM 1) can form cache memory, such as a four-way-set associative cache memory, that serves the computer system with a lower access time than the main memory 424.

In one example, the described cache approach can allow for trade-offs, such as cost, as a printed circuit board (PCB) layout can be optimized by providing a combination of a relatively small fast cache memory formed by cache controller 420, first and second memory controllers 412, 414, and first and second memory units 416, 418 (DRAM 0 and DRAM 1) with a relatively large fast main memory formed by a main memory controller 422 and a main memory 424 a performance similar to that of a main memory that is both relatively large and relatively fast.

In a four-way-set associative cache arrangement, the cache controller 420 can select one of four possible ways to allocate the data storage in the first and second memory units 416, 418 (DRAM 0 and DRAM 1). The cache controller 420 can store metadata to indicate which way (if any) was allocated to store the data in the first and second memory units 416, 418 (DRAM 0 and DRAM 1). The metadata can include a tag field per way to indicate the way allocated for data storage of a particular OS page, and can include a valid field to indicate which chunks of up-to-date data for that particular OS page are held in the first and second memory units 416, 418 (DRAM 0 and DRAM 1) and can include a dirty field to indicate which chunks of data for that particular OS page are more up-to-date in the first and second memory units 416, 418 (DRAM 0 and DRAM 1) than in the main memory 424. In other words, the four-way-set associative cache arrangement provides flexibility to an arrangement that defines how a particular OS page can be stored within in the first and second memory units 416, 418 (DRAM 0 and DRAM 1), and whether it is stored there at all.

In one example, the cache controller 420 can select an address bit for data interleaving, and the address bit can be provided to the memory controller fabric 410 for consumption. Based on the address bit, the memory controller fabric 410 can send memory commands to the first and second memory controllers 412, 414 (memory controller 0 and memory controller 1), such that the first and second memory controllers 412, 414 (memory controller 0 and memory controller 1) store the data on the first and second memory units 416, 418 (DRAM 0 and DRAM 1). In addition, the address bit can control an arrangement with which data for the OS page is allocated between the first and second memory units 416, 418 (DRAM 0 and DRAM 1).

In the example shown in FIG. 4, based on the address received from the memory controller fabric 410, which can include the way used to store each OS page, the first memory controller 412 (memory controller 0) can store a first chunk of data block A ($A_0$) in one half of a second page of the first memory unit 416 (DRAM 0), and the second memory controller 414 (memory controller 1) can store a second chunk of data block A ($A_1$) in one half a second page of the second memory unit 418 (DRAM 1). Similarly, the first memory controller 412 (memory controller 0) can store a first chunk of data block B ($B_0$) in one half of a first page of the first memory unit 416 (DRAM 0), and the second memory controller 414 (memory controller 1) can store a second chunk of data block B ($B_1$) in one half of a first page of the second memory unit 418 (DRAM 1). In other words, provided that the address bit falls within the page size, each page of data (i.e., A and B) can be stored with a total of one half in the first memory unit 416 (DRAM 0) and a total containing the second half in the second memory unit 418 (DRAM 1).

In one example, as each OS page is stored half in first memory unit 416 (DRAM 0) and half in second memory unit 418 (DRAM 1), there can be empty half-pages in the pages of each memory unit. These pages may not actually be unused but can instead store half pages possibly belonging to other sets in the cache. In an alternate arrangement, the cache can be arranged, for example, to have eight ways per set, with the upper four half-pages of the memory units 416 and 418 holding ways zero through three, and the lower four half pages of the memory units 416 and 418 holding ways four through seven.

As an example, when data block A and data block B are each 4 KB in size, and where interleave is every 2048 bytes, a first 2 KB for data blocks A and B can be stored in the first memory unit 416 (DRAM 0), and a second 2 KB for data blocks A and B can be stored in the second memory unit 418 (DRAM 1). Therefore, in this example, $A_0$, $A_1$, $B_0$ and $B_1$ can each be 2048 bytes in size.

In one example, when data block A and data block B are each 4 KB in size, and where the interleave is every 128 bytes, a first 128 bytes for data blocks A and B, and every alternate 128 bytes for data blocks A and B after that can be stored in the first memory unit 416 (DRAM 0), and the remaining (odd-numbered) 128 byte units for data blocks A and B can be stored in the second memory unit 418 (DRAM 1). Therefore, in this example also, $A_0$, $A_1$, $B_0$ and $B_1$ can each be 2048 bytes in size, although containing respectively different subsets of data blocks A and B to the example where interleave is every 2048 bytes.

In one example, when the first and second memory units 416, 418 (DRAM 0 and DRAM 1) are being used as cache memory, data storage may not be limited in terms of which pages in the first and second memory units 416, 418 (DRAM 0 and DRAM 1) are used to store the data blocks (e.g., A and B). However, a record can be maintained to ensure consistent access to the same pages in the first and second memory units 416, 418 (DRAM 0 and DRAM 1) according to the use of tag field to match way in the cache controller 420.

In one example, the cache controller 420 can direct which interleave is to be used (for example from the aforementioned options of 2 KByte and 128 bytes) when accessing data for an individual data block such as A from memory locations of the first and second memory units 416, 418 (DRAM 0 and DRAM 1), provided that it does so in a consistent manner for as long as the data is held at their respective memory locations. This consistency can be assured by the cache controller 420 maintaining a record of the interleave it has chosen for each OS page allocated in the cache. The cache controller 420 can utilize this record for other data manipulations as well. For example, the cache controller 420 can perform the data manipulations of inverting values of stored data or rearranging an order of stored data, and then the cache controller 420 can perform the reverse data manipulations after retrieving the data using the record.

Figure 5:
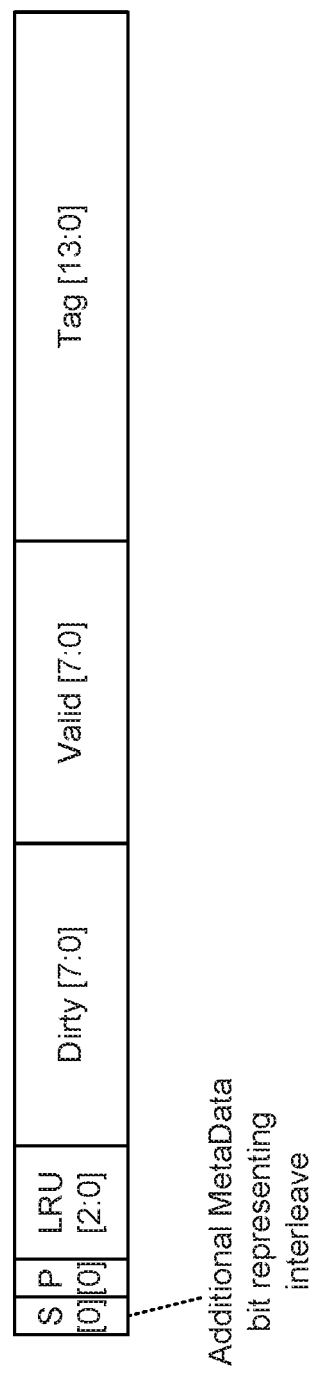
FIG. 5 illustrates a metadata field associated with a cache entry in accordance with an example.

FIG. 5 illustrates an exemplary metadata field associated with a cache entry. The cache entry can be allocated by a cache controller for data storage. The metadata field can be assigned to each cache entry, which can correspond to a collection of data block chunks (e.g., $A_0$ and $A_1$). Each entry of the cache can have a metadata field. The metadata field can include an S bit to represent an interleave policy used when accessing data for the cache entry in a cache memory (e.g., DRAM). The interleave policy can be applicable to both read and write operations. The S bit can indicate which address bits of the entry are to control the interleave. The S bit can be set to a first value (e.g., "0") to indicate that data access is interleaved between a plurality of cache memories in accordance with a value of a first address bit. For example, when the value of the S bit is 0, address bit 11 can be chosen to control the interleave of data between the plurality of cache memories, resulting in an interleave of every 2048 bytes (i.e., the first 2048 bytes of data can be accessed from a first cache memory and the second 2048 bytes of data would be accessed from a second cache memory). In addition, the S bit can be set to a second value (e.g., "1") to indicate that data access is interleaved between the plurality of cache memories in accordance with a value of a second address bit. For example, when the value of the S bit is 1, address bit 7 can be chosen to control the interleave of data between the plurality of cache memories, resulting in an interleave every 128 bytes. In other words, a first choice of address bit 11 corresponds to a coarse-granularity interleave and a second choice of address bit value 7 corresponds to a fine-granularity interleave. In addition, the metadata can include a Pinning indication (P) bit, a Least Recently Used (LRU) field that comprises 3 bits, a Dirty field that comprises 8 bits, a Valid field that comprises 8 bits, and a Tag field that comprises 14 bits. The metadata may be formed in any number of different manners with differing choices, widths, and arrangements of metadata bits.

In one configuration, the cache controller can allocate a cache entry to store a data block (e.g., 4 KB in size). During allocation, the cache controller can determine a location in which to store the data block. For example, the cache controller can select between one of four "ways" to store the data block, each "way" may correspond to a different page in each of multiple cache memories. In addition, the cache controller can determine whether the data block is associated with a high-bandwidth data stream or a low-bandwidth data stream. The cache controller can make this determination using a number of factors, such as heuristics, an indication by a requesting agent, a request that the data block not be evicted from the cache memories, etc. The heuristics can include past relationships between a source of memory transactions and a number of sequential requests received from that source. In addition, the heuristics can include information regarding previous memory bottlenecks occurring with certain CPU threads.

Based on the determination of whether the data block is associated with the high-bandwidth data stream or the low-bandwidth data stream, the cache controller can assign an S bit value to the metadata field corresponding to the cache entry, wherein the S bit value indicates the interleave policy that is applicable for both read and write operations. In one example, when the data block is associated with a low-bandwidth data stream, the S bit can be set to the first value (e.g., "0") to indicate that data access is interleaved between multiple cache memories in accordance with the value of a first selected address bit. In another example, when the data block is associated with a high-bandwidth data stream, the S bit can be set to the second value (e.g., "1") to indicate that data access is interleaved between the multiple cache memories in accordance with the value of a second address bit. The data access can be applicable to both read and write operations.

In an alternate configuration, a configurable interleave policy can be implemented without the presence of the additional S bit in the metadata field by simply deeming certain 'ways' of the cache to have a certain interleave policy (for example, that data access is interleaved between multiple cache memories in accordance with the value of the first chosen address bit) and that other 'ways' of the cache are deemed to have a different interleave policy (for example, that data access is interleaved between multiple cache memories in accordance with the value of a second chosen address bit). For example, ways 0, 1, 2 of any particular cache set can access cache memory using a coarse granularity interleave (for example using a first address bit 11, with data being interleaved between the plurality of cache memories every 2048 bytes) and the remaining way of the cache set can access cache memory using a fine granularity interleave (for example using a second address bit 7, with data be interleaved between the plurality of cache memories every 128 bytes). During allocation, the cache controller can determine whether the data block is associated with a high-bandwidth data stream or a low-bandwidth data stream, and prefer to allocate in way 3 for those associated with high-bandwidth data streams and with ways 0, 1, 2 for those associated with low-bandwidth data streams.

Figure 6A:
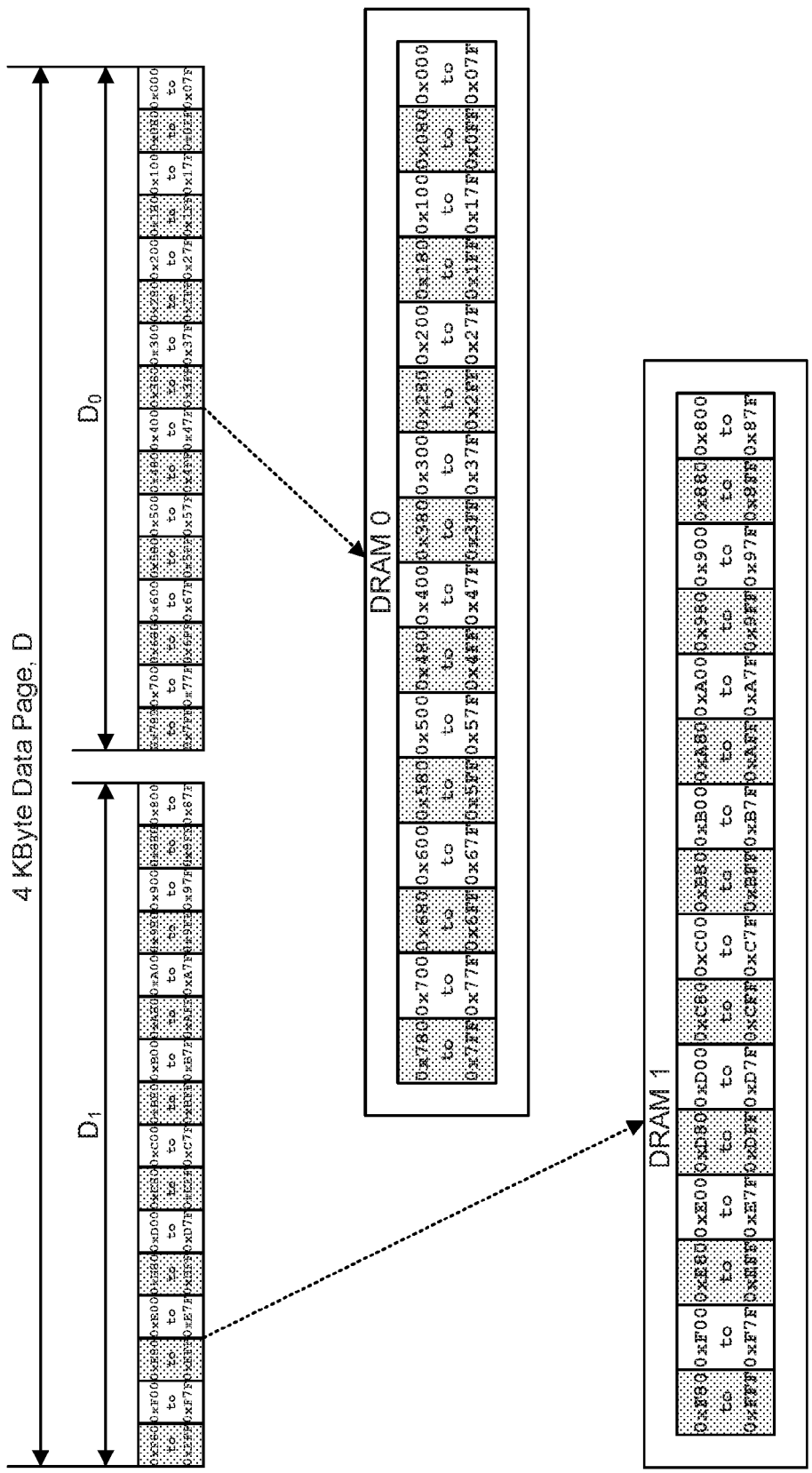
FIG. 6A illustrates a technique for interleaving data access across multiple memory units based on an interleave policy in accordance with an example.
Figure 6B:
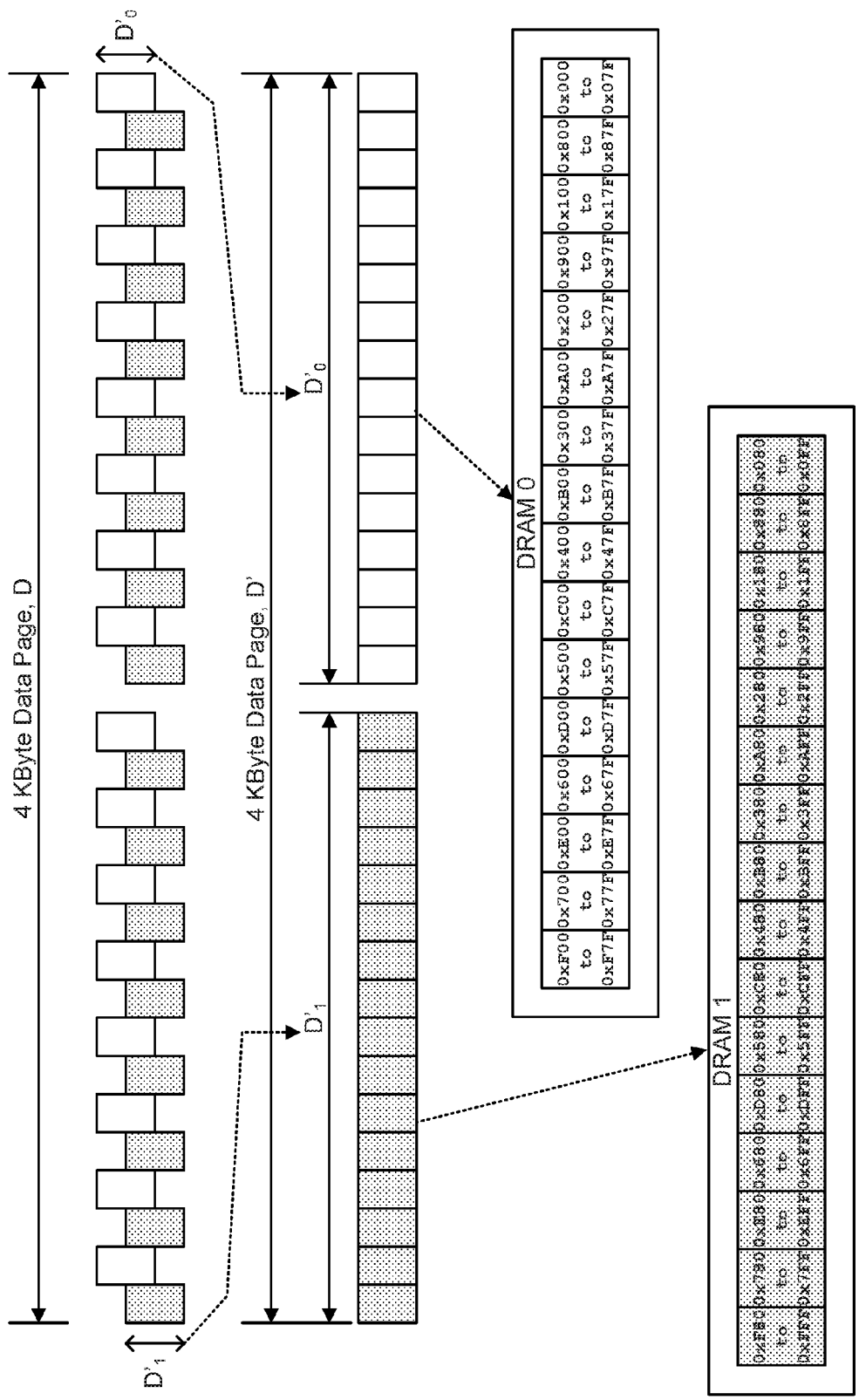
FIG. 6B illustrates a technique for interleaving data access across multiple memory units based on an interleave policy in accordance with an example.

FIG. 6A and FIG. 6B illustrate an exemplary technique for interleaving data access across multiple memory units based on an interleave policy. Data access can be interleaved across two cache memories (DRAM 0 and DRAM 1). The data can be a 4 KB block of data, D. The data of D is depicted as a set of thirty-two chunks, each shown as a small vertical rectangular box, and each containing 128 bytes of data. The start and end address offset for the data of each chunk, relative to the first address of the data of D is shown by the hexadecimal numbers inside the box representing each chunk. The 4 KB block of data can be equivalent to a page of data. A cache entry can be allocated to store the data, and the cache entry can be associated with a metadata field. The metadata field can include an S bit. The S bit can define the interleave policy to access the data across the two cache memories.

In this example, illustrated by FIG. 6A, when the S bit is set to a defined value (e.g., "0"), the data can be accessed across the two cache memories in accordance with an address bit choice of address bit 11, which corresponds to 2048 bytes. In FIG. 6A, the 4 KB block of data can be split into two chunks. The first 2 KB, $D_0$ (offset 0x000 to 0x7FF) can be stored in the first cache memory (DRAM 0), and the second 2 KB, $D_1$ (offset 0x800 to 0xFFF) can be stored in the second cache memory (DRAM 1). An agent that serially accesses the 4 KB block of data can first be serviced by the first cache memory (DRAM 0) and then the second cache memory (DRAM 1).

Furthermore pertaining to this example, when the S bit is set to an alternate predefined value (e.g., "1"), the data can be accessed across the two cache memories in accordance with an address bit choice of address bit 7, which corresponds to 128 bytes In this example, illustrated by FIG. 6B, the 4 KB block of data can be split into 128 byte data chunks, and the 128 byte data chunks can be interleaved across the two cache memories (DRAM 0 and DRAM 1). In other words, 128 byte data chunks of the 4 KB block of data can be sequentially accessed (e.g., read or written) across the two cache memories (DRAM 0 and DRAM 1). For example, in a sequential manner, a first data chunk can be accessed in the first cache memory (DRAM 0), a second data chunk can be accessed in the second cache memory (DRAM 1), a third data chunk can be accessed in the first cache memory (DRAM 0), a fourth data chunk can be accessed in the second cache memory (DRAM 1), and so on. The 4 KB block of data can be segmented into 32 128-byte data chunks. In one example, the 16 even 128-byte data chunks ($D'_0$) can be accessed in the first cache memory (DRAM 0), and the 16 odd 128-byte data chunks ($D'_1$) can be accessed in the second cache memory (DRAM 1). In addition, an agent can serially access the 4 KB block of data by having multiple data requests that are pending at a given time, and the multiple data requests can be serviced by both the two memory controllers (memory controller 0 and memory controller 1) and two cache memories (DRAM 0 and DRAM 1) in a near-simultaneous, and efficient manner.

Figure 7:
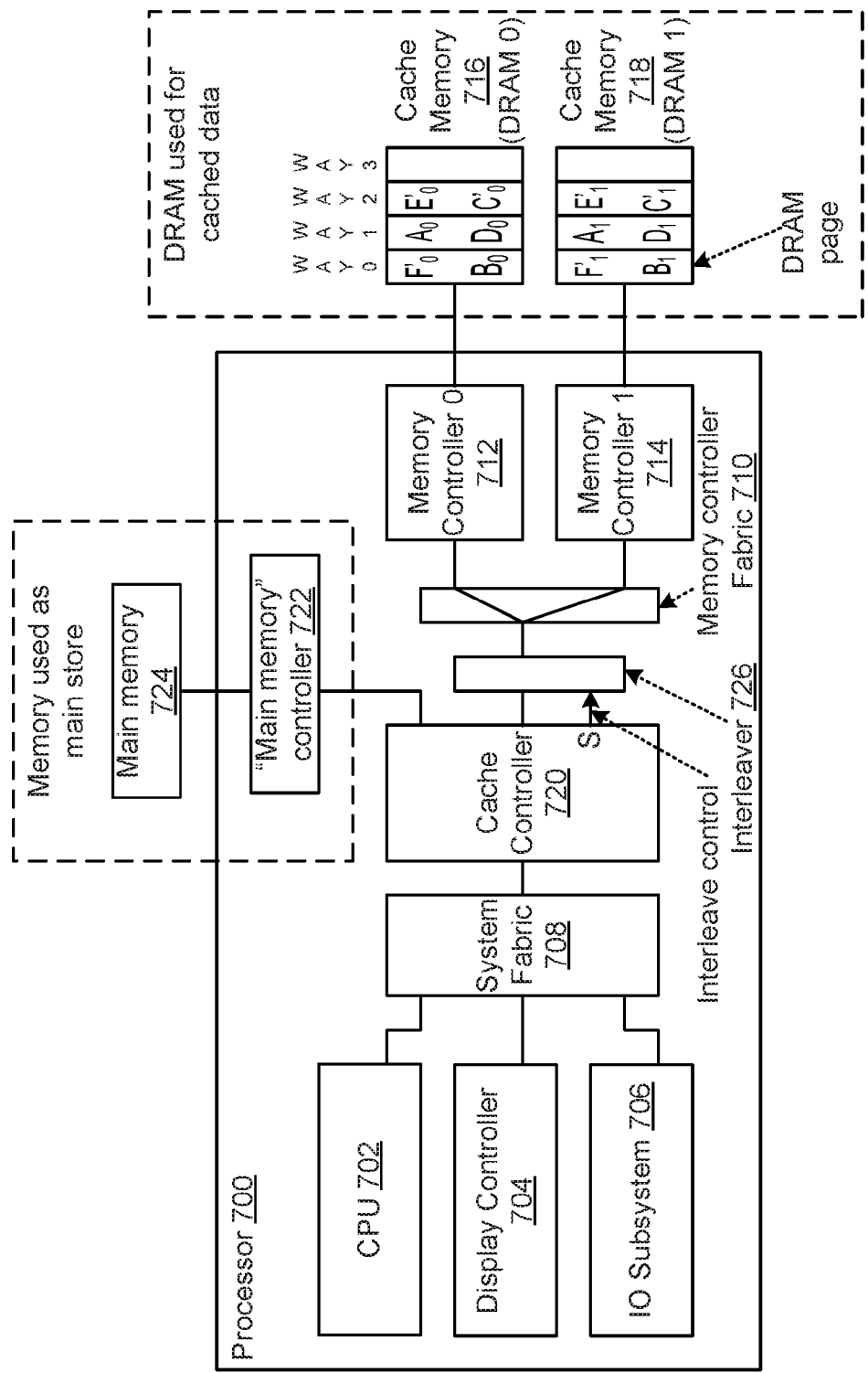
FIG. 7 depicts a computer system that includes a cache controller and an interleaver for facilitating data access across multiple cache memories in accordance with an example.

FIG. 7 depicts an exemplary processor 700 that includes a cache controller 720 and an interleaver 726 for facilitating data access across multiple cache memories. The processor 700 can be a system on chip (SOC). The processor 700 can be included in a two-level memory (2LM) computer system. The multiple cache memories can include a first cache memory 716 (DRAM 0) and a second cache memory 718 (DRAM 1), which can respectively be connected to multiple memory controllers. The multiple memory controllers can include a first memory controller 712 (memory controller 0) and a second memory controller 712 (memory controller 1). The processor 700 can include a central processing unit (CPU) 702, a display controller 704 (or display engine), and an input/output (I/O) subsystem 708. The CPU 702, display controller 704 and I/O subsystem 706 can be connected to a system fabric 708. The system fabric 708 can be connected to the cache controller 720. The cache controller 720 can be connected to a main memory controller 722 and a main memory 724. In addition, the cache controller 720 can be connected to a memory controller fabric 710, which can be connected to an interleaver 726. The interleaver 726 can be connected to the first memory controller 712 (memory controller 0) and the second memory controller 714 (memory controller 1). The interleaver 726 and memory controller fabric 710 can be integrated into a single combined unit. An equivalent operation of portions interleaver 726 and memory controller fabric 710 can be implemented by logic operation of each memory controller (for example, by each memory controller seeing transactions for all memory controllers, yet only responding to those transactions that would have been directed to it by an interleaver and memory controller fabric arrangement).

In one example, the cache controller 720 can allocate a cache entry to store a data block (e.g., 4 KB in size) across the first and second cache memories 716, 718. The cache controller 720 can determine whether the data block is associated with a high-bandwidth data stream or a low-bandwidth data stream. The cache controller 720 can make this determination using a number of factors, such as heuristics, an indication by a requesting agent, a request that the data block not be evicted from the cache memories, etc. Based on this determination, the cache controller 720 can assign an S bit value to a metadata field corresponding to the cache entry. The S bit value can indicate an interleave policy for accessing the data block across the first and second cache memories 716, 718. The interleave policy can be applicable to both read and write operations. In one example, when the data block is associated with a low-bandwidth data stream, the S bit can be set to a first value (e.g., "0") to indicate that data access is interleaved between the first and second cache memories 716, 718 in accordance with the value of the first address bit. For example, for the first address bit 11, the data block can be interleaved between the first and second cache memories 716, 718 every 2048 bytes. In another example, when the data block is associated with a high-bandwidth data stream, the S bit can be set to a second value (e.g., "1") to indicate that data access is interleaved between the first and second cache memories 716, 718 in accordance with the second value. For example, for the second address bit 7, the data block can be interleaved between the first and second cache memories 716, 718 every 128 bytes. In one example, for a given address bus A[35:0], a selected address bit is A[11] (for S=0) or A[7] (for S=1).

In one example, the interleaver 726 can receive from the cache controller 720 an indication of the S bit for the cache entry (or data block) being written to or read from the first and second cache memories 716, 718. The interleaver 726 can forward the memory command or memory transaction to the memory controller fabric 710. Based on the indication of the S bit, the interleaver 726 can modify a memory command or memory transaction to reflect the S bit. As an example, the interleaver 726 can modify the memory command or memory transaction to reflect a defined S bit value. For example, a memory controller fabric 710 that always interleaves according to address bit 11 may be integrated with an interleaver 726 where interleaver 726 selectively swaps the value of address bit 11 with the value of address bit 7 for transactions sent towards memory controller fabric 710, the swap taking place when the S bit value is '1'. (Thus, when the S bit value is '1' the memory controller fabric 710 is actually interleaving based on the value of address bit 7, even though it is examining the address bit 11 it has received from the interleaver 726 which is actually address bit 7 sent by the cache controller 720). The memory controller fabric 710 can send the memory command or memory transaction to the first and second memory controllers 712, 714 (memory controller 0 and memory controller 1) for accessing the data block from the first and second cache memories 716, 718 in accordance with the defined S bit value. The interleaver 726 can be integrated with the cache controller 720, such that the address sent from the cache controller 720 to a memory controller fabric 710 may already reflect the swap between address bits 7 and 11 for the case where S=1, allowing use of a memory fabric 710 that always interleaves according to the value of the address bit 11 that it receives.

As shown in the example in FIG. 7, the cache controller 720 can determine that data blocks C, E and F (which are each 4 KB in size) are to be accessed across the first and second cache memories 716, 718 (DRAM 0 and DRAM 1) in accordance with an interleave policy directed towards high-speed access. In this example, the cache controller 716 can set the metadata field for the associated cache entries to include an S bit value of "1". The data blocks (or data pages)

C, E and F can be accessed across the first and second cache memories 716, 718 (DRAM 0 and DRAM 1) as $C'_0$ and $C'_1$, $E'_0$ and $E'_1$, and $F'_0$ and $F'_1$, and the data blocks C, E and F can be interleaved using 128 byte data chunks in accordance with the S bit value of "1". In addition, the cache controller 720 can determine that data blocks A, B and D (which are each 4 KB in size) are to be accessed across the first and second cache memories 716, 718 (DRAM 0 and DRAM 1) in accordance with an interleave policy directed towards low-speed access. In this example, the cache controller 716 can set the metadata field for the associated cache entries to include an S bit value of "0". The data blocks (or data pages) A, B and D can be accessed across the first and second cache memories 716, 718 (DRAM 0 and DRAM 1) as $A_0$ and $A_1$, $B_0$ and $B_1$, and $D_0$ and $D_1$, and the data blocks A, B and D can be interleaved using 2048 byte data chunks in accordance with the S bit value of "0". Therefore, the interleave policy can be applied or configured on a data block by cache entry (for example data block) basis (e.g., a page by page basis), and the interleave policy can be indicated in the metadata field for the cache entry allocated for each data block.

In one example, the cache controller 720 can use the S bit value in the metadata field to calculate a cache memory address to be accessed during a cache access transaction, or alternatively, the interleaver circuit 726 can use the S bit value in the metadata field to modify a cache memory address to be accessed during a cache access transaction. The memory fabric controller 710 can receive the cache access transaction from the cache controller 720 and/or the interleaver 726. In a first example, the memory fabric controller 710 can select a memory controller (e.g., the first memory controller 712 or the second memory controller 714) from a plurality of memory controllers to relay the cache access transaction, wherein the memory controller is selected based on the S bit value in the metadata field. In a second example, the memory fabric controller 710 can relay the cache access transaction to multiple memory controllers (e.g., the first memory controller 712 and the second memory controller 714), wherein each of the multiple memory controllers are configured to determine whether to perform the cache access transaction based on the S bit value in the metadata field. In a third example, the memory fabric controller 710 can select a memory controller (e.g., the first memory controller 712 or the second memory controller 714) to relay the cache access transaction based on a memory address of the cache access transaction.

In one example, the memory controller fabric 710 can receive the cache access transaction, and the memory controller fabric 710 can relay the cache access transaction to multiple memory controllers. The cache controller 720 can use the value in the metadata field to calculate a memory address of the cache access transaction delivered to the memory controller fabric 710. The memory controllers (e.g., the first memory controller 712 and the second memory controller 714) can use the memory address of the cache access transaction to determine whether to perform the cache access transaction.

In one example, the cache controller 720 can infer the metadata value to assign to the cache entry based on heuristics. For example, the heuristics can include past relationships between a source of memory transactions and a number of sequential requests received from that source. The heuristics can include information regarding previous memory bottlenecks occurring with certain CPU threads. In another example, the cache controller 720 can determine the value in the metadata field to assign to the cache entry based on a number of cache access transactions received to a page of data while servicing a cache miss. In yet another example, the cache controller 720 can determine the value in the metadata field to assign to the cache entry based on an identity of a processor entity initiating the memory access transaction that causes the cache entry to be allocated at the cache controller 720. The processor entity can include a processor block, processor sub-bock, CPU, CPU thread, etc.

In one example, the interleaver 726 can direct data between the cache controller 720 and one or more memory controllers 712, 714 in accordance with the value in the metadata field, thereby maintaining data consistency where a memory controller data bus width is smaller than a cache controller data bus width.

In another example, the cache controller 720 can include a mechanism to allow modification of the interleave policy already applied to a cache entry. The interleave policy can be modified by: re-shuffling portions of the stored data for the cache entry between the first and second cache memories 716, 718; and updating the value in the metadata field to indicate a new interleave policy to be applied when accessing the data from the first and second cache memories 716, 718.

In one example, the interleaver 726 can perform various actions on the data. For example, the interleaver 726 can shift data lanes for forward write data or return read data. For example, system fabric data paths can be 256 bytes wide and data paths to each memory controller can be 128 bytes wide. When the interleaving occurs every 128 bytes, a 256-byte chunk of data on the system fabric is the juxtaposition of a 128 byte chunk of data from each memory controller. However, when the interleaving is performed at an increased granularity level, such as every 2048 bytes, then a chunk of data on the system fabric can represent two 128 byte chunks of data from one of the memory controllers.

Figure 8A:
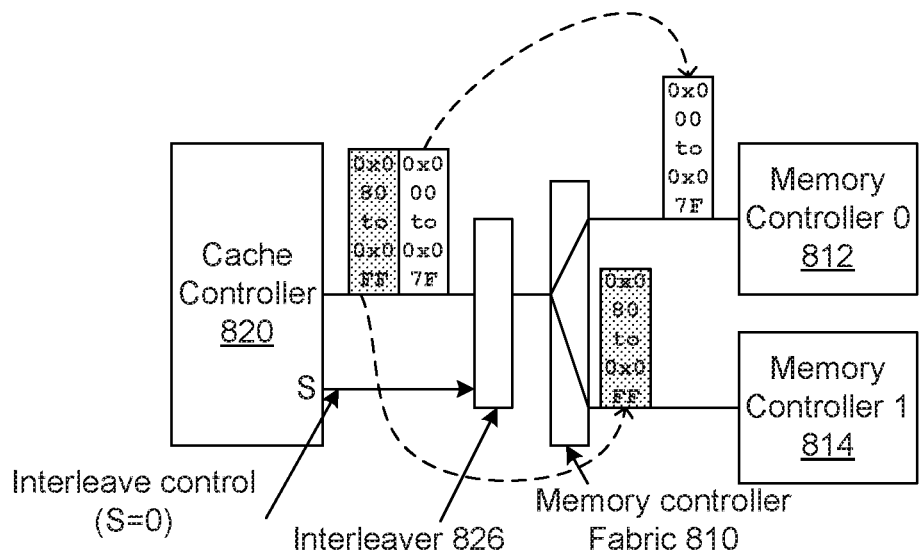
FIGS. 8A to 8D illustrate computer systems in accordance with an example.
Figure 8B:
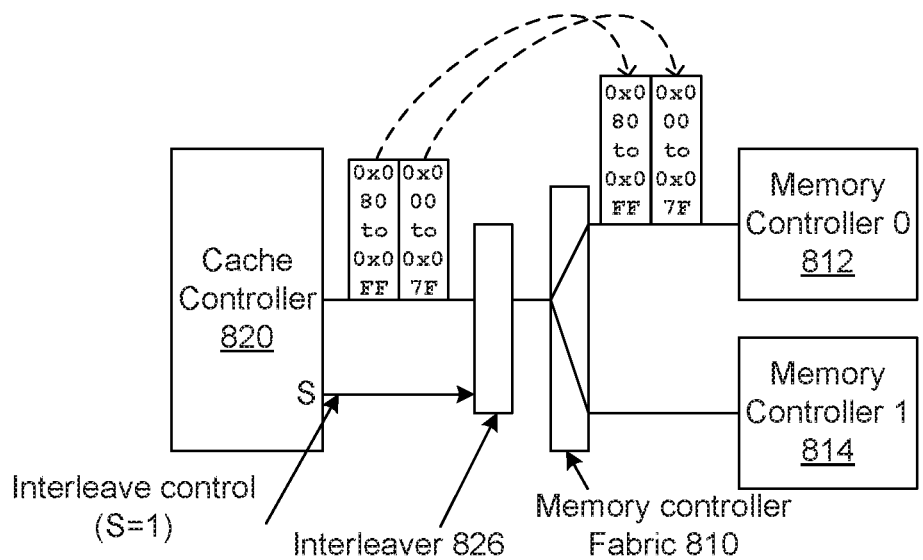

FIGS. 8A to 8D illustrate exemplary computer systems that include a cache controller 820, an interleaver 826, a memory controller fabric 810, a first memory controller 812 (memory controller 0) and a second memory controller 814 (memory controller 1). In FIGS. 8A and 8B, a data bus size at the cache controller 820 can be the same as a data bus size at the first and second memory controllers 812, 814, wherein for example, the data bus size can be 128 bytes wide. Each 128-byte chunk of data (which can include the data of each memory write request of two sequential requests in system memory address and in time) can be placed on the data bus of a particular memory controller to which a memory transaction is sent, which is in accordance with an address in cache memory and an interleave control bit (or S bit). In FIG. 8A, a pair of memory transactions can be sequentially sent to the first and second memory controllers 812, 814. In contrast, in FIG. 8B, due to a different interleave setting that causes the interleave to be at a coarser granularity level, both memory transactions can be sent sequentially to the same memory controller, such as the first memory controller 812 (memory controller 0).

Figure 8C:
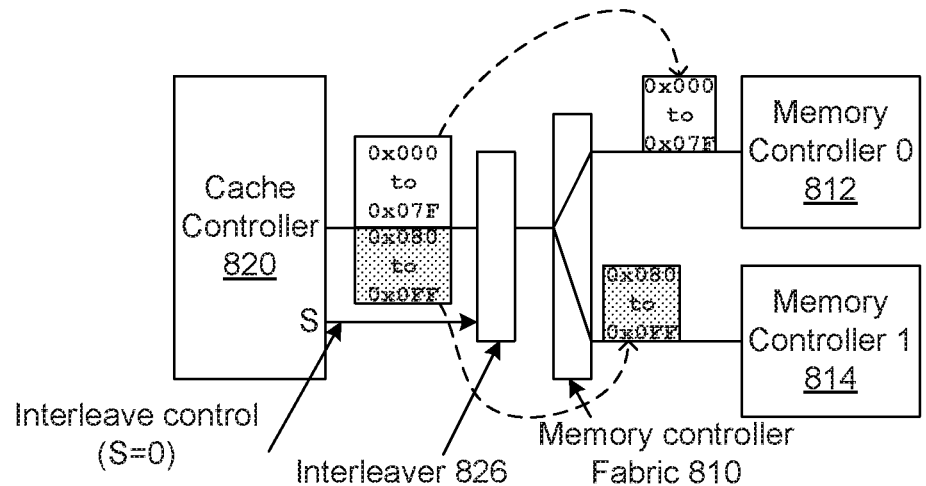
Figure 8D:
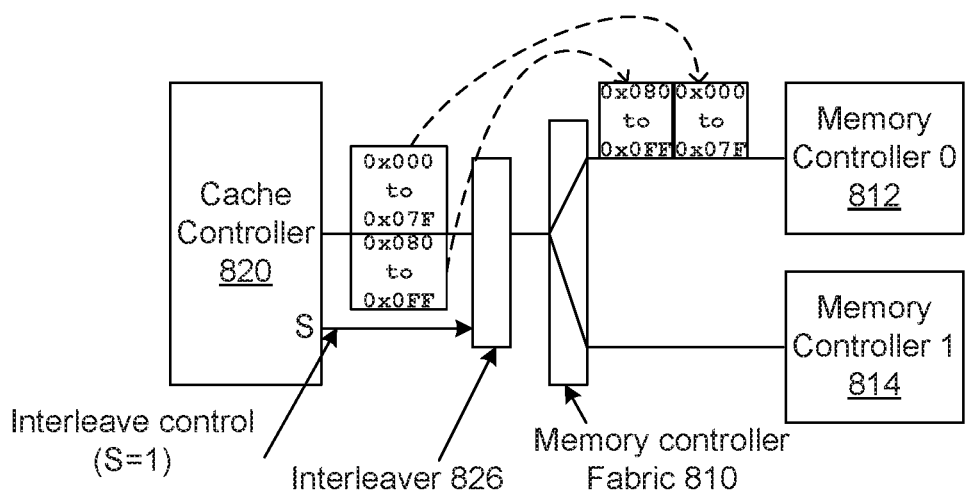

In FIGS. 8C and 8D, the data bus of the cache controller 820 can be twice the width of the data bus of the first and second memory controllers 812, 814, for example, being 256 bytes wide. The two chunks of data (which represent sequential requests in the system memory address) can be presented together across the data bus width at the same time. In FIG. 8C, due to the interleave control bit (or S bit) inferring interleave between one data chunk and the next data chunk, the data can be split such that data on a "top half" of the data bus carrying the first 128 bytes of data can delivered to the first memory controller 812 (memory controller 0), whereas a "bottom half" of the data bus carrying the next 128 bytes of data can be delivered to the second memory controller 814 (memory controller 1), these transactions may be issued to the memory controllers also essentially at the same time as each other.

In FIG. 8D, due to a different interleave setting that causes the interleave to be at a coarser granularity level, both halves of the cache controller data bus can be sent sequentially to the same memory controller, such as the first memory controller 812 (memory controller 0). In this case, the interleaver 826 can first send data from the "top half" of the data bus to the first memory controller 812 (memory controller 0), and then subsequently send data from the "bottom half" of the data bus to that same memory controller (e.g., the first memory controller 812). Thus, the interleaver 826 can have the capability of selectively transferring data from bytes 0-127 or bytes 128-255 of the data bus from the cache controller 820 onto the 128-byte buses going to each of the first and second memory controllers 812, 814. In addition, the interleaver 826 can temporarily store some of the data chunks as the interleaver 826 funnels data from the wide bus from the cache controller 820 into the narrow bus of a particular memory controller when the interleave setting causes these sequential chunks to be sent to the same memory controller.

Similarly, when reading data from cache memory, the interleaver 826 can juxtapose received chunks of data from the first and second memory controllers 812, 814 to form a wider returned data to the cache controller 820. In some cases, the interleaver 826 can take two sequential chunks of read data from one of the first and second memory controllers 812, 814 and then simultaneously place the two chunks of read data on separate halves of the data bus to the cache controller 820 in order to return the data correctly to the cache controller 820. In doing this, the interleaver 826 can temporarily store some of the data chunks as the interleaver 826 aggregates data from the narrow bus of a single memory controller to the wider bus of the cache controller 820.

Figure 9:
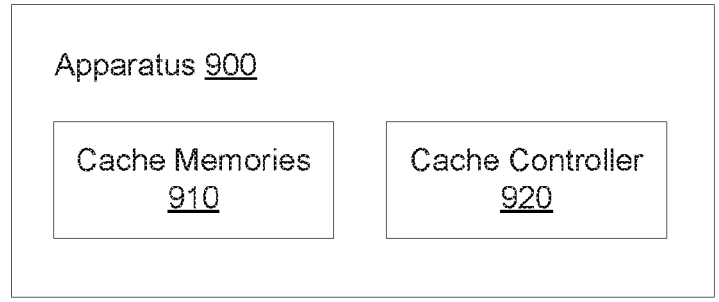
FIG. 9 illustrates an apparatus in accordance with an example.

FIG. 9 illustrates an example of an apparatus 900. The apparatus 900 can include a plurality of cache memories 910 and a cache controller 920. The cache controller 920 can be configured to allocate a cache entry to store data across the plurality of cache memories 910. The cache controller 920 can be configured to assign a metadata field to the cache entry, wherein the metadata field includes a value to indicate an interleave policy to be applied when accessing the data across more than one cache memory in the plurality of cache memories 910.

Figure 10:
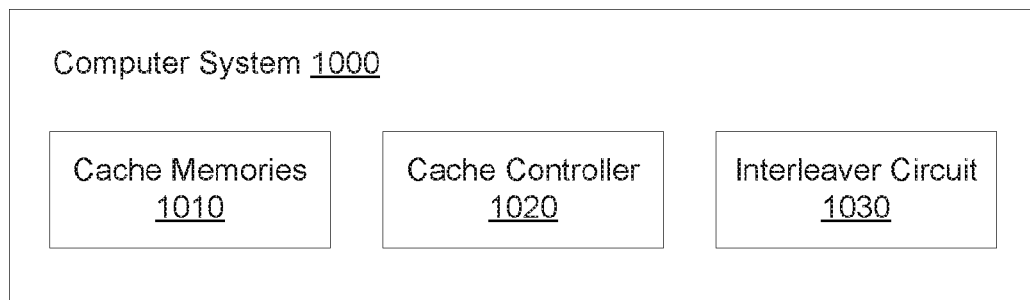
FIG. 10 illustrates a computer system in accordance with an example.

FIG. 10 illustrates an example of a computer system 1000. The computer system 100 can include a plurality of cache memories 1010, a cache controller 1020 and an interleaver circuit 1030. The cache controller 1020 can be configured to allocate a cache entry to store data across more than one cache memory in the plurality of cache memories 1010. The cache controller 1020 can be configured to assign a metadata field to the cache entry, wherein the metadata field includes a value to indicate an interleave policy to be applied when accessing the data across more than one cache memory in the plurality of cache memories 1010. The interleaver circuit 1030 can be configured to use the value in the metadata field to modify a cache memory address to be accessed during a cache access transaction.

Figure 11:
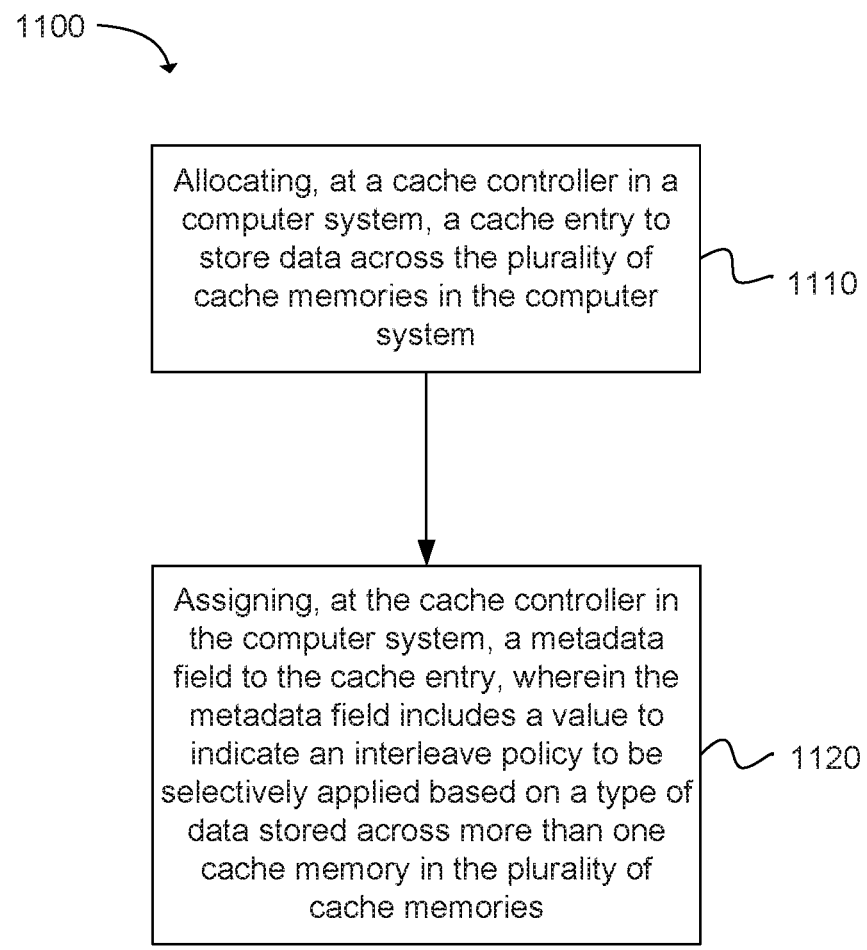
FIG. 11 depicts a flowchart of a method for interleaving data storage across a plurality of cache memories in accordance with an example.

Another example provides a method 1100 for interleaving data storage across a plurality of cache memories, as shown in the flow chart in FIG. 11. The method can be executed as instructions on a machine, where the instructions are included on at least one computer readable medium or one non-transitory machine readable storage medium. The method can include the operation of: allocating, at a cache controller in a computer system, a cache entry to store data across more than one cache memory in the plurality of cache memories in the computer system, as in block 1110. The method can include the operation of: assigning, at the cache controller in the computer system, a metadata field to the cache entry, wherein the metadata field includes a value to indicate an interleave policy to be applied when accessing the data across more than one cache memory in the plurality of cache memories, as in block 1120.

Figure 12:
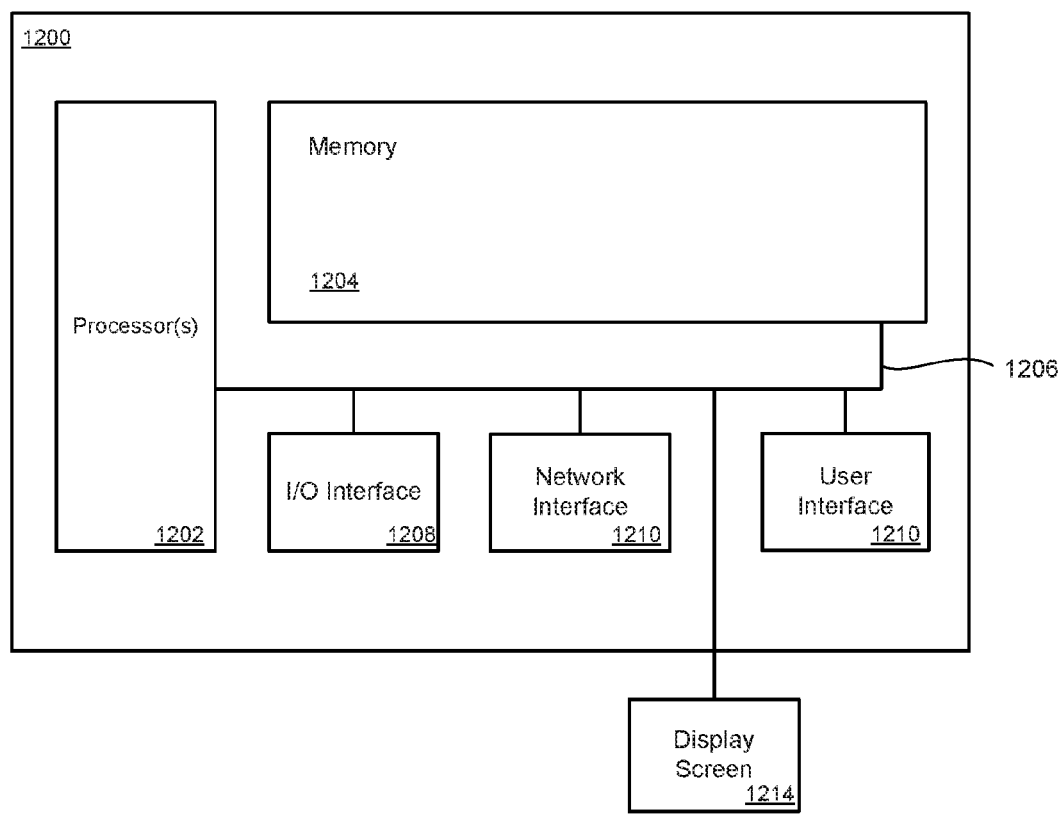
FIG. 12 illustrates a computing system that includes a data storage device in accordance with an example.

FIG. 12 illustrates a general computing system or device 1200 that can be employed in the present technology. The computing system 1200 can include a processor 1202 in communication with a memory 1204. The memory 1204 can include any device, combination of devices, circuitry, and the like that is capable of storing, accessing, organizing and/or retrieving data. Non-limiting examples include volatile or non-volatile RAM, phase change memory, optical media, hard-drive type media, and the like, including combinations thereof.

The computing system or device 1200 additionally includes a local communication interface 1206 for connectivity between the various components of the system. For example, the local communication interface 1206 can be a local data bus and/or any related address or control busses as may be desired.

The computing system or device 1200 can also include an I/O (input/output) interface 1208 for controlling the I/O functions of the system, as well as for I/O connectivity to devices outside of the computing system 1200. A network interface 1210 can also be included for network connectivity. The network interface 1210 can control network communications both within the system and outside of the system. The network interface can include a wired interface, a wireless interface, a Bluetooth interface, optical interface, and the like, including appropriate combinations thereof. Furthermore, the computing system 1200 can additionally include a user interface 1212, a display device 1214, as well as various other components that would be beneficial for such a system.

The processor 1202 can be a single processor or multiple processors. The local communication interface 1206 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data.

One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

Examples

The following examples pertain to specific invention embodiments and point out specific features, elements, or steps that can be used or otherwise combined in achieving such embodiments.

In one example there is provided an apparatus, comprising:
a plurality of cache memories; and
a cache controller configured to:
allocate a cache entry to store data across the plurality of cache memories, the cache entry including a value in a metadata field indicating an interleave policy; and
selectively assign the interleave policy to be applied based on a type of data stored in the plurality of cache memories.

In one example of an apparatus, the interleave policy is configured on a page by page basis for data storage in the plurality of cache memories.

In one example of an apparatus, the cache controller is further configured to use the value in the metadata field to calculate a cache memory address to be accessed during a cache access transaction.

In one example of an apparatus, the apparatus further comprises:
an interleaver circuit configured to use the value in the metadata field to modify a cache memory address to be accessed during a cache access transaction.

In one example of an apparatus, the apparatus further comprises:
a plurality of memory controllers; and
a memory controller fabric configured to:
receive a cache access transaction; and
select a memory controller from the plurality of memory controllers to relay the cache access transaction, wherein the memory controller is selected based on the value in the metadata field associated with the cache entry.

In one example of an apparatus, the apparatus further comprises:
a memory controller fabric configured to:
receive a cache access transaction; and
relay the cache access transaction to multiple memory controllers,
wherein each of the multiple memory controllers are configured to determine whether to perform the cache access transaction based on the value in the metadata field.

In one example of an apparatus, the apparatus further comprises:
a plurality of memory controllers; and
a memory controller fabric configured to:
receive a cache access transaction; and
select a memory controller to relay the cache access transaction based on a memory address of the cache access transaction.

In one example of an apparatus, the apparatus further comprises:
a memory controller fabric configured to:
receive a cache access transaction; and
relay the cache access transaction to multiple memory controllers,
wherein the cache controller is configured to use the value in the metadata field to calculate a memory address of the cache access transaction delivered to the memory controller fabric; and
a plurality of memory controllers configured to use the memory address of the cache access transaction to determine whether to perform the cache access transaction.

In one example of an apparatus, the interleaver circuit is further configured to:
direct data between the cache controller and one or more memory controllers in accordance with the value in the metadata field, thereby maintaining data consistency where a memory controller data bus width is smaller than a cache controller data bus width.

In one example of an apparatus:
the metadata field includes a first value to indicate that storage of the data is interleaved between the plurality of cache memories in accordance with a value of a first address bit; and
the metadata field includes a second value to indicate that storage of the data is interleaved between the plurality of cache memories in accordance with a value of a second address bit.

In one example of an apparatus:
the data is interleaved between the plurality of cache memories every 128 bytes when the metadata field includes the value of the first address bit; and
the data is interleaved between the plurality of cache memories at an interval greater than 128 bytes when the metadata field includes the value of the second address bit.

In one example of an apparatus, the data stored across the plurality of cache memories is an operating system (OS) page of data comprising 4096 bytes.

In one example of an apparatus, the cache controller is configured to infer the metadata value to assign to the cache entry based on heuristics.

In one example of an apparatus, the cache controller is configured to determine the value in the metadata field to assign to the cache entry based on an identity of a processor entity initiating the memory access transaction that causes the cache entry to be allocated at the cache controller.

In one example of an apparatus, the cache controller is configured to determine the value in the metadata field to assign to the cache entry based on a number of cache access transactions received to a page of data while servicing a cache miss.

In one example of an apparatus, the data is stored across the plurality of cache memories in accordance with the interleave policy to enable data access at a desired memory bandwidth.

In one example of an apparatus, the plurality of cache memories include dynamic random-access memory (DRAM).

In one example of an apparatus, the interleave policy applied to the cache entry is modified by:
  re-shuffling portions of the stored data for the cache entry between the cache memories; and
  updating the value in the metadata field to indicate a new interleave policy to be applied when accessing the data from the cache memories.

In one example there is provided a computer system, comprising:
  a plurality of cache memories;
  a cache controller configured to:
    allocate a cache entry to store data across the plurality of cache memories, the cache entry including a value in a metadata field indicating an interleave policy; and
    selectively assign the interleave policy to be applied based on a type of data stored in the plurality of cache memories; and
  an interleaver circuit configured to use the value in the metadata field to modify a cache memory address to be accessed during a cache access transaction.

In one example of a computer system, the computer system further comprises:
  a plurality of memory controllers; and
  a memory controller fabric configured to:
    receive the cache access transaction; and
    select one or more memory controllers from the plurality of memory controllers to relay the cache access transaction, wherein the one or more memory controllers are selected based on the value in the metadata field associated with the cache entry.

In one example of a computer system, the interleave policy is configured on a page by page basis for data storage in the plurality of cache memories.

In one example of a computer system, the data is stored across the plurality of cache memories in accordance with the interleave policy to enable data access at a desired memory bandwidth.

In one example of a computer system, the interleaver circuit is further configured to: direct the data between the cache controller and one or more memory controllers in accordance with the value in the metadata field, thereby maintaining data consistency where a memory controller data bus width is smaller than a cache controller data bus width.

In one example of a computer system:
  the metadata field includes a first value to indicate that storage of the data is interleaved between the plurality of cache memories in accordance with a value of a first address bit; and
  the metadata field includes a second value to indicate that storage of the data is interleaved between the plurality of cache memories in accordance with a value of a second address bit.

In one example of a computer system, the computer system comprises a two-level memory computer system.

In one example of a computer system, the computing system further comprises:
  a display communicatively coupled to one or more processors;
  a network interface communicatively coupled to the one or more processors; or
  a battery coupled to the one or more processors.

In one example there is provided a method for interleaving data storage across a plurality of cache memories, the method comprising:
  allocating, at a cache controller in a computer system, a cache entry to store data across the plurality of cache memories in the computer system; and
  assigning, at the cache controller in the computer system, a metadata field to the cache entry, wherein the metadata field includes a value to indicate an interleave policy to be selectively applied based on a type of data stored across more than one cache memory in the plurality of cache memories.

In one example of a method for interleaving data storage across a plurality of cache memories, the method further comprises: using, at the cache controller in the computer system, the value in the metadata field to calculate a cache memory address to be accessed during a cache access transaction.

In one example of a method for interleaving data storage across a plurality of cache memories, the method further comprises: configuring the interleave policy on a page by page basis for data storage in the plurality of cache memories.

In one example of a method for interleaving data storage across a plurality of cache memories, the method further comprises: inferring, at the cache controller, the metadata value to assign to the cache entry based on heuristics.

In one example of a method for interleaving data storage across a plurality of cache memories, the method further comprises: determining, at the cache controller, the value in the metadata field to assign to the cache entry based on an identity of a processor entity initiating the memory access transaction that causes the cache entry to be allocated at the cache controller.

In one example of a method for interleaving data storage across a plurality of cache memories, the method further comprises: determining, at the cache controller, the value in the metadata field to assign to the cache entry based on a number of cache access transactions received to a page of data while servicing a cache miss.

In one example of a method for interleaving data storage across a plurality of cache memories, the method further comprises: modifying the interleave policy applied to the cache entry by: re-shuffling portions of the stored data for the cache entry between the cache memories; and updating the value in the metadata field to indicate a new interleave policy to be applied when accessing the data from the cache memories.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An apparatus, comprising:
  a plurality of cache memories; and
  a cache controller configured to:
    allocate a cache entry to store data across the plurality of cache memories, the cache entry including a value in a metadata field indicating an interleave policy; and
    selectively assign the interleave policy to be applied based on a type of data stored in the plurality of cache memories.

2. The apparatus of claim 1, wherein the interleave policy is configured on a page by page basis for data storage in the plurality of cache memories.

3. The apparatus of claim 1, wherein the cache controller is further configured to use the value in the metadata field to calculate a cache memory address to be accessed during a cache access transaction.

4. The apparatus of claim 1, further comprising:
an interleaver circuit configured to use the value in the metadata field to modify a cache memory address to be accessed during a cache access transaction.

5. The apparatus of claim 1, further comprising:
a plurality of memory controllers; and
a memory controller fabric configured to:
receive a cache access transaction; and
select a memory controller from the plurality of memory controllers to relay the cache access transaction, wherein the memory controller is selected based on the value in the metadata field associated with the cache entry.

6. The apparatus of claim 1, further comprising:
a memory controller fabric configured to:
receive a cache access transaction; and
relay the cache access transaction to multiple memory controllers,
wherein each of the multiple memory controllers are configured to determine whether to perform the cache access transaction based on the value in the metadata field.

7. The apparatus of claim 1, further comprising:
a plurality of memory controllers; and
a memory controller fabric configured to:
receive a cache access transaction; and
select a memory controller to relay the cache access transaction based on a memory address of the cache access transaction.

8. The apparatus of claim 1, further comprising:
a memory controller fabric configured to:
receive a cache access transaction; and
relay the cache access transaction to multiple memory controllers,
wherein the cache controller is configured to use the value in the metadata field to calculate a memory address of the cache access transaction delivered to the memory controller fabric; and
a plurality of memory controllers configured to use the memory address of the cache access transaction to determine whether to perform the cache access transaction.

9. The apparatus of claim 4, whereby the interleaver circuit is further configured to:
direct data between the cache controller and one or more memory controllers in accordance with the value in the metadata field, thereby maintaining data consistency where a memory controller data bus width is smaller than a cache controller data bus width.

10. The apparatus of claim 1, wherein:
the metadata field includes a first value to indicate that storage of the data is interleaved between the plurality of cache memories in accordance with a value of a first address bit; and
the metadata field includes a second value to indicate that storage of the data is interleaved between the plurality of cache memories in accordance with a value of a second address bit.

11. The apparatus of claim 10, wherein:
the data is interleaved between the plurality of cache memories every 128 bytes when the metadata field includes the value of the first address bit; and
the data is interleaved between the plurality of cache memories at an interval greater than 128 bytes when the metadata field includes the value of the second address bit.

12. The apparatus of claim 1, wherein the data stored across the plurality of cache memories is an operating system (OS) page of data comprising 4096 bytes.

13. The apparatus of claim 1, wherein the cache controller is configured to infer the metadata value to assign to the cache entry based on heuristics.

14. The apparatus of claim 1, wherein the cache controller is configured to determine the value in the metadata field to assign to the cache entry based on an identity of a processor entity initiating a memory access transaction that causes the cache entry to be allocated at the cache controller.

15. The apparatus of claim 1, wherein the cache controller is configured to determine the value in the metadata field to assign to the cache entry based on a number of cache access transactions received to a page of data while servicing a cache miss.

16. The apparatus of claim 1, wherein the data is stored across the plurality of cache memories in accordance with the interleave policy to enable data access at a desired memory bandwidth.

17. The apparatus of claim 1, wherein the plurality of cache memories include dynamic random-access memory (DRAM).

18. The apparatus of claim 1, wherein the interleave policy applied to the cache entry is modified by:
re-shuffling portions of the stored data for the cache entry between the cache memories; and
updating the value in the metadata field to indicate a new interleave policy to be applied when accessing the data from the cache memories.

19. A method for interleaving data storage across a plurality of cache memories, the method comprising:
allocating, at a cache controller in a computer system, a cache entry to store data across the plurality of cache memories in the computer system; and
assigning, at the cache controller in the computer system, a metadata field to the cache entry, wherein the metadata field includes a value to indicate an interleave policy to be selectively applied based on a type of data stored across more than one cache memory in the plurality of cache memories.

20. The method of claim 19, further comprising: using, at the cache controller in the computer system, the value in the metadata field to calculate a cache memory address to be accessed during a cache access transaction.

21. The method of claim 19, further comprising: configuring the interleave policy on a page by page basis for data storage in the plurality of cache memories.

22. The method of claim 19, further comprising: inferring, at the cache controller, the metadata value to assign to the cache entry based on heuristics.

23. The method of claim 19, further comprising: determining, at the cache controller, the value in the metadata field to assign to the cache entry based on an identity of a processor entity initiating a memory access transaction that causes the cache entry to be allocated at the cache controller.

24. The method of claim 19, further comprising: determining, at the cache controller, the value in the metadata field to assign to the cache entry based on a number of cache access transactions received to a page of data while servicing a cache miss.

25. The method of claim 19, further comprising: modifying the interleave policy applied to the cache entry by:
   re-shuffling portions of the stored data for the cache entry between the cache memories; and
   updating the value in the metadata field to indicate a new interleave policy to be applied when accessing the data from the cache memories.

* * * * *